United States Patent
Zhu

(10) Patent No.: US 9,564,434 B2
(45) Date of Patent: Feb. 7, 2017

(54) SEMICONDUCTOR DEVICE WITH BODY SPACER AT THE BOTTOM OF THE FIN AND METHOD FOR MANUFACTURING THE SAME

(71) Applicant: Institute of Microelectronics, Chinese Academy of Sciences, Beijing (CN)

(72) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/705,835

(22) Filed: May 6, 2015

(65) Prior Publication Data

US 2015/0270263 A1 Sep. 24, 2015

Related U.S. Application Data

(63) Continuation of application No. PCT/CN2012/085248, filed on Nov. 26, 2012.

(30) Foreign Application Priority Data

Nov. 9, 2012 (CN) .......................... 2012 1 0448458

(51) Int. Cl.
*H01L 29/00* (2006.01)
*H01L 27/088* (2006.01)
(Continued)

(52) U.S. Cl.
CPC ..... *H01L 27/0886* (2013.01); *H01L 21/02274* (2013.01); *H01L 21/02381* (2013.01);
(Continued)

(58) Field of Classification Search
CPC ............ H01L 29/66795; H01L 29/785; H01L 27/0886; H01L 21/845; H01L 27/1211; H01L 27/0924; H01L 29/41791
See application file for complete search history.

(56) References Cited

U.S. PATENT DOCUMENTS

2004/0217434 A1 11/2004 Lee et al.
2007/0102763 A1  5/2007 Yeo et al.
(Continued)

FOREIGN PATENT DOCUMENTS

CN    101924133 A    12/2010
CN    102104069 A     6/2011
CN    102157554 A     8/2011

OTHER PUBLICATIONS

International Search Report and Written Opinion in international application No. PCT/CN2012/085248, mailed on Aug. 15, 2013.
(Continued)

*Primary Examiner* — Ngan Ngo
(74) *Attorney, Agent, or Firm* — Knobbe, Martens, Olson & Bear, LLP

(57) ABSTRACT

A semiconductor device and a method of manufacturing the same are disclosed. In one aspect, the method includes forming a first semiconductor layer and a second semiconductor layer sequentially on a substrate. The method also includes patterning the second and first semiconductor layers to form an initial fin. The method also includes selectively etching the first semiconductor layer of the initial fin to form a lateral recess in the first semiconductor layer. The method also includes filling the lateral recess with a dielectric material to form a body spacer. The method also includes forming an isolation layer on the substrate, wherein the isolation layer partially exposes the body spacer and thus defines a fin above the isolation layer. The method also includes forming a gate stack intersecting the fins on the isolation layer.

11 Claims, 10 Drawing Sheets

(51) Int. Cl.

| | | |
|---|---|---|
| | *H01L 29/78* | (2006.01) |
| | *H01L 29/66* | (2006.01) |
| | *H01L 29/417* | (2006.01) |
| | *H01L 21/8238* | (2006.01) |
| | *H01L 27/092* | (2006.01) |
| | *H01L 21/84* | (2006.01) |
| | *H01L 27/12* | (2006.01) |
| | *H01L 21/02* | (2006.01) |
| | *H01L 21/306* | (2006.01) |
| | *H01L 21/3105* | (2006.01) |
| | *H01L 21/762* | (2006.01) |
| | *H01L 21/8234* | (2006.01) |
| | *H01L 29/06* | (2006.01) |
| | *H01L 29/16* | (2006.01) |
| | *H01L 29/161* | (2006.01) |
| | *H01L 29/51* | (2006.01) |

(52) U.S. Cl.
CPC .. *H01L 21/02532* (2013.01); *H01L 21/30604* (2013.01); *H01L 21/31053* (2013.01); *H01L 21/76224* (2013.01); *H01L 21/823431* (2013.01); *H01L 21/823481* (2013.01); *H01L 21/823821* (2013.01); *H01L 21/845* (2013.01); *H01L 27/0924* (2013.01); *H01L 27/1211* (2013.01); *H01L 29/0653* (2013.01); *H01L 29/16* (2013.01); *H01L 29/161* (2013.01); *H01L 29/41791* (2013.01); *H01L 29/517* (2013.01); *H01L 29/6681* (2013.01); *H01L 29/66545* (2013.01); *H01L 29/66795* (2013.01); *H01L 29/785* (2013.01)

(56) References Cited

U.S. PATENT DOCUMENTS

| | | |
|---|---|---|
| 2010/0258870 A1 | 10/2010 | Hsu et al. |
| 2011/0198676 A1 | 8/2011 | Luo et al. |
| 2011/0298050 A1 | 12/2011 | Luo et al. |
| 2014/0284723 A1* | 9/2014 | Lee ............... H01L 27/0924 257/369 |

OTHER PUBLICATIONS

Chinese Office Action dated Jan. 19, 2016 for Chinese Application No. 20120448458.4.

* cited by examiner

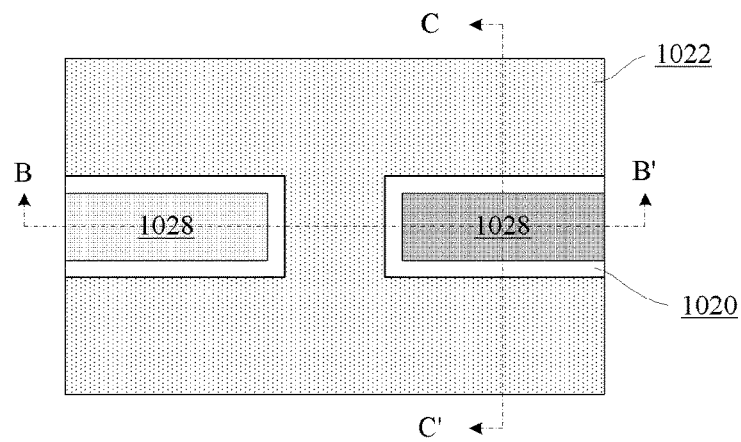
Fig. 13A
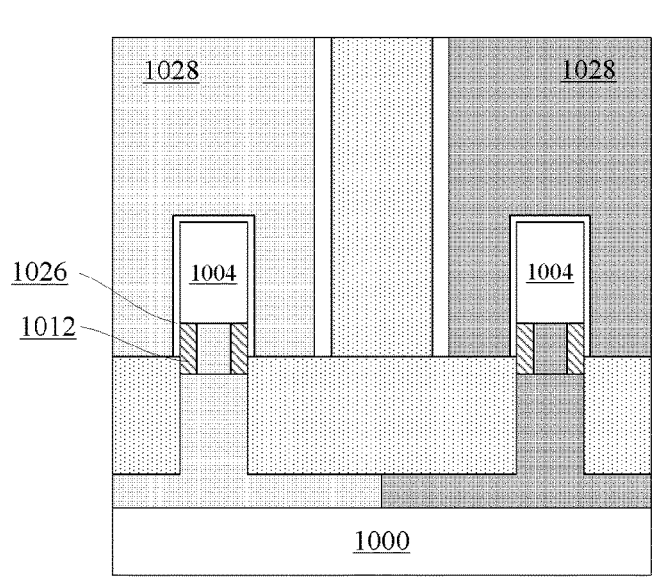 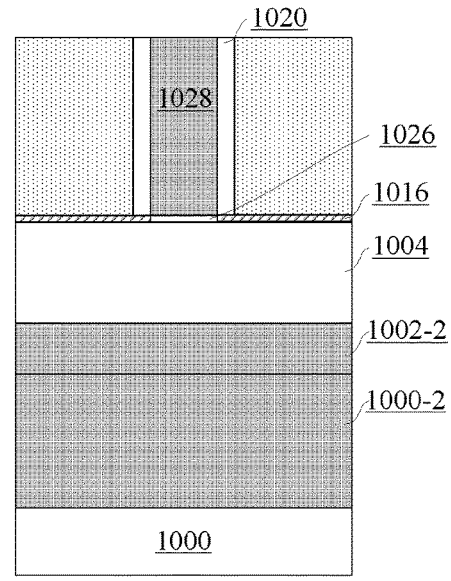
Fig. 13B　　　　　　　　Fig. 13C

SEMICONDUCTOR DEVICE WITH BODY SPACER AT THE BOTTOM OF THE FIN AND METHOD FOR MANUFACTURING THE SAME

RELATED APPLICATIONS

This application claims priority to International Application No. PCT/CN2012/085248, filed on Nov. 26, 2012, entitled "SEMICONDUCTOR DEVICE AND METHOD FOR MANUFACTURING THE SAME," and Chinese Patent Application No. 201210448458.4, filed on Nov. 9, 2012, each of which is incorporated herein by reference in its entirety.

BACKGROUND

Description of the Related Technology

The disclosed technology relates to semiconductor technology, and particularly to a FinFET with a gate stack intersecting two fins on an isolation layer, and methods for manufacturing the same.

Description of the Related Technology

Short channel effects are getting more significant as planar semiconductor devices are increasingly scaled down. To this end, three-dimensional (3D) semiconductor devices, such as fin field effect transistors (FinFETs), have been proposed. Generally, a FinFET includes a fin formed vertically on a substrate and a gate stack intersecting the fin. As such, a channel is formed in the fin, and has a width defined basically by a height of the fin. Unfortunately, it is difficult to control fins formed on a wafer to have the same height during manufacture of an integrated circuit (IC), resulting in inconsistency in performance of devices across the wafer.

On the other hand, a parasitic capacitance is formed at the bottom of the fin due to dielectric between the gate and the fin. If the parasitic capacitance is too large, the response time of the device will become too long.

SUMMARY OF CERTAIN INVENTIVE ASPECTS

The disclosed technology includes a FinFET with a gate stack intersecting two fins on an isolation layer, and methods for manufacturing the same.

One aspect of the disclosed technology is a method of manufacturing a FinFET. The method includes forming a first semiconductor layer and a second semiconductor layer sequentially on a substrate. The method further includes patterning the second and first semiconductor layers to form an initial fin. The method further includes selectively etching the first semiconductor layer of the initial fin to form a lateral recess in the first semiconductor layer. The method further includes filling the lateral recess with a dielectric material to form a body spacer. The method further includes forming an isolation layer on the substrate, wherein the isolation layer partially exposes the body spacer, and thus defines a fin above the isolation layer. The method further includes forming a gate stack intersecting the fins on the isolation layer Another aspect of the disclosed technology is a FinFET manufactured by the method as mentioned above. The device includes a substrate. The device further includes a first semiconductor layer. The device further includes a second semiconductor layer, the first and second semiconductor layers patterned, the first and second semiconductor layers sequentially formed on the substrate. The device further includes an isolation layer formed on the substrate, wherein the isolation layer has a top surface located between top and bottom surfaces of the first semiconductor layer, and thus defines a fin above the isolation layer. The device further includes a gate stack formed on the isolation layer and intersecting the fin, wherein the first semiconductor layer has a lateral recess relative to the second semiconductor layer, and the semiconductor device further comprises a body spacer formed in the lateral recess.

BRIEF DESCRIPTION OF THE DRAWINGS

The above and other objects, features, and advantages of the disclosed technology will become apparent from following description of embodiments when read in conjunction with the accompanying drawings.

FIG. 13A is a view during an intermediate step of the method of manufacturing a FinFET device according to an embodiment of the disclosed technology.

FIG. 13B is a cross sectional view along line BB' in FIG. 13A during an intermediate step of the method of manufacturing a FinFET device according to an embodiment of the disclosed technology.

FIG. 13C is a cross sectional view along line CC' in FIG. 13A during an intermediate step of the method of manufacturing a FinFET device according to an embodiment of the disclosed technology.

DETAILED DESCRIPTION OF CERTAIN EMBODIMENTS

Figure 1:
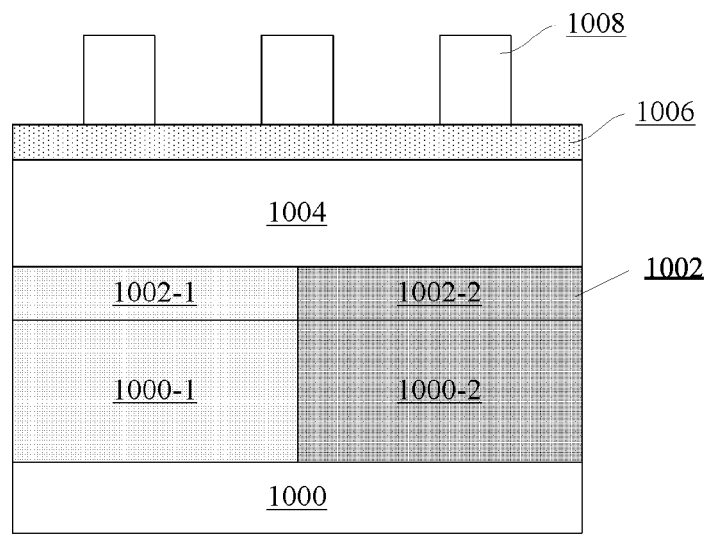
FIG. 1 is a cross sectional view during an intermediate step of the method of manufacturing a FinFET device according to an embodiment of the disclosed technology.

Next, the disclosed technology will be explained in detail with reference to the drawings. Similar components throughout the drawings are indicated by similar reference numbers. The drawings are not drawn to scale for purpose of clarity. These descriptions are provided for illustrative purpose, rather than limiting the disclosed technology. Further, descriptions of known structures and techniques are omitted so as not to obscure the concept of the disclosed technology.

Moreover, shapes and relative sizes and positions of regions and layers shown in the drawings are also illustrative, and deviations may occur due to manufacture tolerances or technique limitations in practice. Those skilled in the art can also devise regions/layers of other different shapes, sizes, and relative positions as desired.

In the context of the disclosed technology, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

In an embodiment of the disclosed technology, at least one semiconductor layer may be formed on a substrate by, for example, epitaxy. In order to form fins having the same height during patterning the fins by, for example, etching, a depth by which the etching is performed into the substrate may be reduced as compared with the conventional technology, and thus it is relatively easy to control the etching depth to be consistent. Further, it is relatively easy to control the epitaxial layer to be uniform in thickness. As a result, it is possible to improve uniformity in thickness for the finally-formed fins. In an embodiment, the depth may even be reduced to zero; in this case, the fins are formed entirely by the at least one semiconductor layer.

In an embodiment, the at least one semiconductor layer includes two or more semiconductor layers, among which adjacent semiconductor layers may have etching selectivity with respect to each other. Therefore, it is possible to selectively etch each of the semiconductor layers. After forming the fin, one (or more) of the semiconductor layers may be selectively etched, and thus narrowed (recessed) in a lateral direction. The lateral recess may be filled with a dielectric material to form a body spacer. In addition, an isolation layer is formed in such a way that the isolation layer partially exposes the body spacer. Therefore, the body spacer is located at the bottom of the finally-formed fin (a portion of the initially-formed fin surrounded by the isolation layer does not act as a true fin where a channel is to be formed).

In this way, at the bottom of the finally-formed fin, dielectric between a subsequently-formed gate and the fin is relatively thick due to the body spacer, and thus a resultant parasitic capacitance is relatively small.

According to an embodiment of the disclosed technology, the isolation layer may be formed by depositing a dielectric material on the substrate and then etching it back. The dielectric material may substantially cover the initially-formed fin, and a portion of the dielectric material on top of the initial fin may have a thickness sufficiently less than that of a portion of the dielectric material on the substrate. For example, the portion of the dielectric material on top of the initial fin may have a thickness less than ⅓, such as ¼, of the thickness of the portion of the dielectric material on the substrate. This may be implemented by, for example, High Density Plasma (HDP) deposition. In case of forming a plurality of initial fins, a portion of the dielectric material on top of each of the initial fins may have a thickness less than half the thickness of a spacing between the fin and its neighboring fin. As such, an etching depth may be reduced in the subsequent back-etching, and thus accuracy for controlling the etching may be improved.

FIG. 1 is a cross sectional view during an intermediate step of the method of manufacturing a FinFET device according to an embodiment of the disclosed technology. As shown in FIG. 1, a substrate 1000 is provided. The substrate 1000 may comprise any suitable substrate in various forms, for example, but not limited to, bulk semiconductor substrate, such as bulk Si substrate, Semiconductor On Insulator (SOI) substrate, SiGe substrate and the like. In the following, a bulk Si substrate is described by way of example for convenience of description.

An n-type well 1000-1 and a p-type well 1000-2 may be formed in the substrate 1000, so that a p-type device and an n-type device may be formed later therein, respectively. For example, the n-type well 1000-1 may be formed by implanting n-type impurities (such as P or As) into the substrate 1000, and the p-type well 1000-2 may be formed by implanting p-type impurities (such as B) into the substrate 1000. If required, annealing may be performed after the implantation. To those skilled in the art, the n-type and p-type wells may be formed in various ways, and detailed descriptions thereof will be omitted here.

A process of forming complementary devices in the respective n-type and p-type wells will be described below, but the disclosed technology is not limited thereto. The disclosed technology is also applicable to a non-complementary process. Further, some of the following processes related to the complementary devices may be not necessary in some implementations.

A first semiconductor layer 1002 may be formed on the substrate 1000 by, for example, epitaxy. In an embodiment, the first semiconductor layer 1002 may comprise SiGe (wherein Ge may have an atomic percentage of about 5-20%), with a thickness of about 10-50 nm. The first semiconductor layer may be doped in-situ while being grown, for example, into p-type by using B. The first semiconductor layer may have a doping concentration higher than that of the underlying p-type well, for example, 1E18-2E19 $cm^{-3}$. In an example, the first semiconductor layer 1002 of p-type may be implanted with C in order to reduce B diffusion.

A portion of the first semiconductor layer 1002-2 on the p-type well 1000-2 may be shielded by photoresist (not shown), and a portion of the first semiconductor layer 1002-1 on the n-type well 1000-1 may be implanted with n-type impurities, such as As or P, and thus converted into n-type, with a doping concentration higher than that of the underlying n-type well, for example, 2E18-4E19 $cm^{-3}$. The photoresist may be then removed. As such, a first n-type semiconductor layer 1002-1 and a first p-type semiconductor layer 1002-2 are formed.

Next, a second semiconductor layer 1004 may be formed on the first semiconductor layer 1002 (including 1002-1 and 1002-2) by, for example, epitaxy. The second semiconductor layer 1004 may include Si, with a thickness of about 20-100 nm.

A protection layer 1006 may be formed on the second semiconductor layer 1004. For example, the protection layer 1006 may comprise oxide (for example, silicon oxide) with a thickness of about 10-50 nm. Such a protection layer 1006 can protect end portions of fins in subsequent processes.

The formed second semiconductor layer 1004, the first semiconductor layer 1002 and the substrate may be then patterned to form initial fins. In an embodiment, photoresist 1008 may be formed and then patterned as designed on the protection layer 1006. The photoresist 1008 may be patterned into a series of parallel, equally spaced lines.

Figure 2:
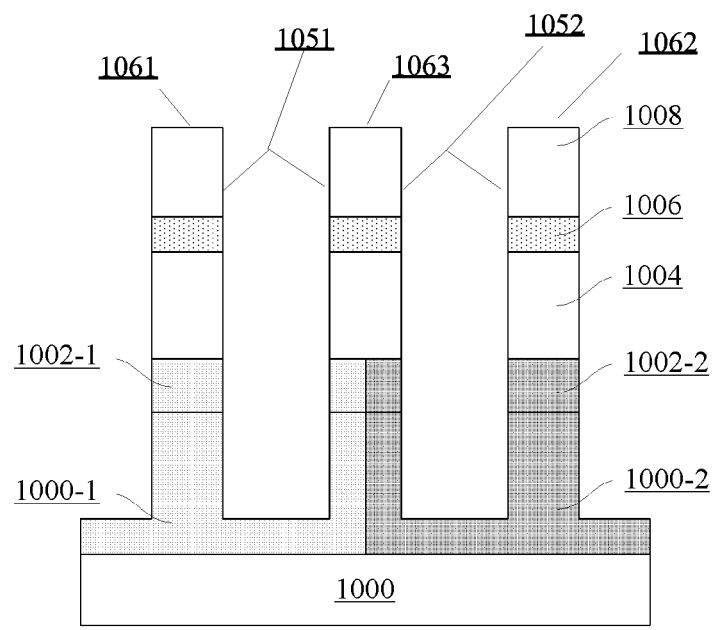
FIG. 2 is a cross sectional view during an intermediate step of the method of manufacturing a FinFET device according to an embodiment of the disclosed technology.

FIG. 2 is a cross sectional view during an intermediate step of the method of manufacturing a FinFET device according to an embodiment of the disclosed technology. Then, as shown in FIG. 2, the protection layer 1006, the second semiconductor layer 1004, the first semiconductor layer 1002 and the substrate 1000 may be sequentially selectively etched by, for example, Reactive Ion Etching (RIE), with the photoresist 1008 as mask, thereby forming the initial fins.

Figure 3:
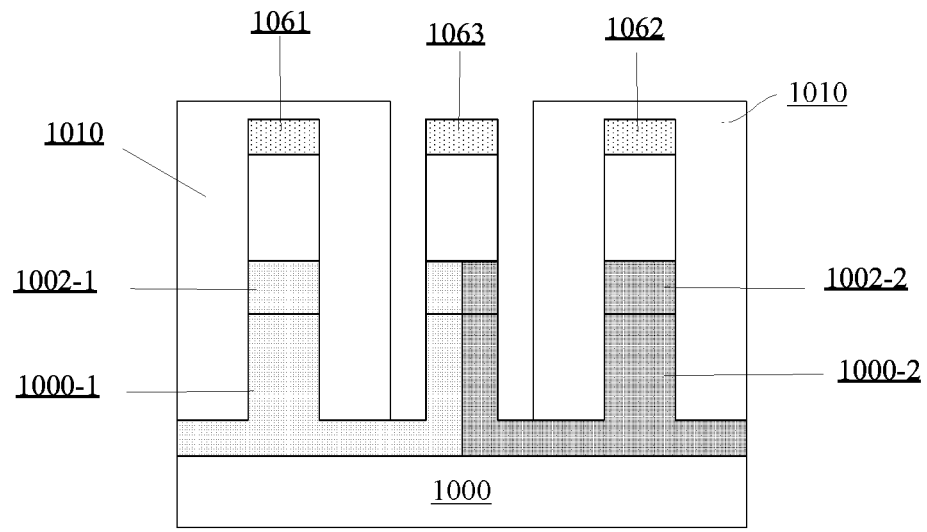
FIG. 3 is a cross sectional view during an intermediate step of the method of manufacturing a FinFET device according to an embodiment of the disclosed technology.

FIG. 3 is a cross sectional view during an intermediate step of the method of manufacturing a FinFET device according to an embodiment of the disclosed technology. In the case of the complementary process, an isolation may be formed between the n-type region (1000-1 and 1002-1) and p-type region (1000-2 and 1002-2) as shown in FIG. 3. In particular, photoresist 1010 may be formed on the substrate, and then patterned to expose a region around an interface between the n-type and p-type regions. Then, portions of the protection layer 1006 and the second and first semiconductor layers 1004 and 1002 existing in this region are selectively etched by, for example, RIE. The substrate 1000 may be further selectively etched by, for example, RIE. As such, an isolation zone is formed between the n-type and p-type regions, and may subsequently be filled with dielectric. Then, the photoresist 1010 may be removed.

It can be seen that in the process of FIG. 2, the etching for forming the original fins 1061, 1062, and 1063 is performed into the substrate 1000. Then, with the process of FIG. 3, a contact area between the p-type and n-type wells (i.e., an area of a resultant pn junction) may be made small. However, the disclosed technology is not limited thereto. For example, in the non-complementary-process or in a local region of devices of a single type (p-type or n-type), the etching of the first semiconductor layer 1002 as described above in conjunction with FIG. 2 may stop on the substrate 1000, and it is not necessary to further etch the substrate 1000; and the process of FIG. 3 may be performed but not necessary. Trenches 1051 and 1052 (between the initial fins 1061 and 1063, and 1063 and 1062, respectively) formed by the etching may have a shape different from the regular rectangular shape as shown in FIG. 2, such as a tapered shape narrowed from top down. In addition, the positions and number of the formed initial fins 1061, 1062, 1063 are not limited to the example as shown in FIG. 2.

Figure 4:
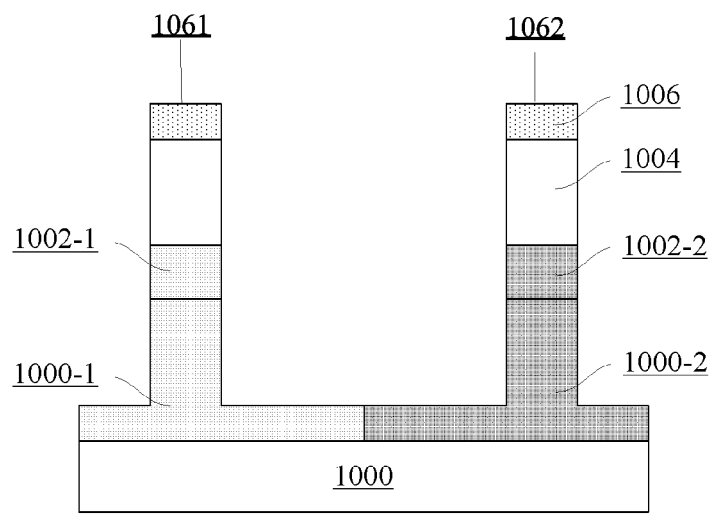
FIG. 4 is a cross sectional view during an intermediate step of the method of manufacturing a FinFET device according to an embodiment of the disclosed technology.

FIG. 4 is a cross sectional view during an intermediate step of the method of manufacturing a FinFET device according to an embodiment of the disclosed technology. In the example of FIG. 2, an initial fin 1063 is also formed at the interface between the n-type well 1000-1 and the p-type well 1000-2. The initial fin 1063 is then removed by the isolation forming process of FIG. 3, resulting in the structure shown in FIG. 4.

Figure 5:
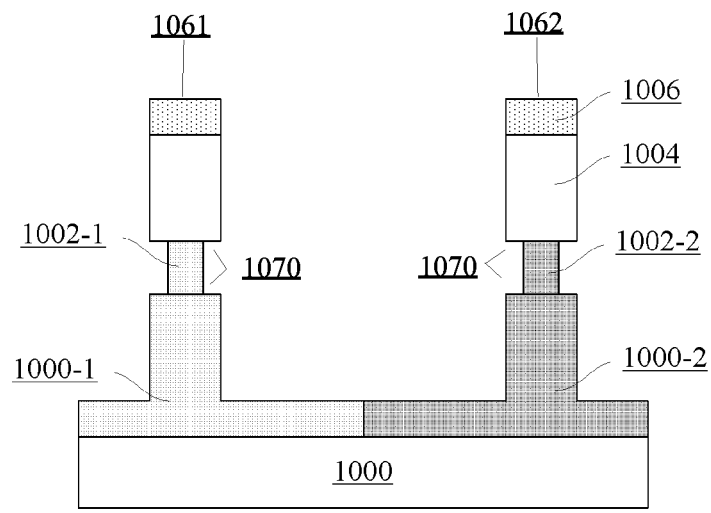
FIG. 5 is a cross sectional view during an intermediate step of the method of manufacturing a FinFET device according to an embodiment of the disclosed technology.

FIG. 5 is a cross sectional view during an intermediate step of the method of manufacturing a FinFET device according to an embodiment of the disclosed technology. To reduce a parasitic capacitance at the bottom of the finally-formed fins, the first semiconductor layer 1002 (such as SiGe) may be selectively etched with respect to the protection layer 1006 (for example, silicon oxide), and also the substrate 1000 and the second semiconductor layer 1004 (such as Si), so that the first semiconductor layer 1002 is recessed in a lateral direction, as shown in FIG. 5. Therefore, a portion of the initial fins 1061 and 1062 that is constituted by the first semiconductor layer 1002 is narrowed.

Figure 6:
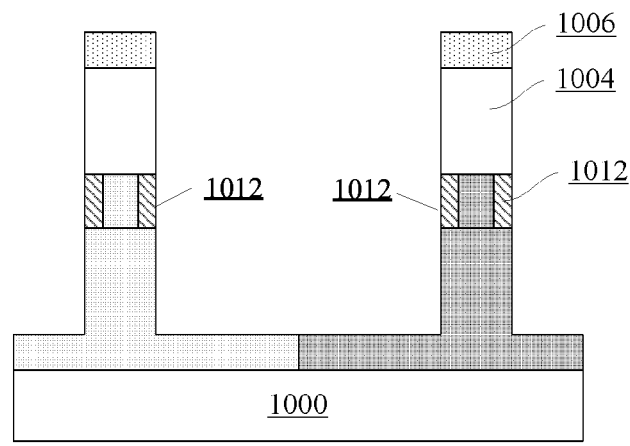
FIG. 6 is a cross sectional view during an intermediate step of the method of manufacturing a FinFET device according to an embodiment of the disclosed technology.

FIG. 6 is a cross sectional view during an intermediate step of the method of manufacturing a FinFET device according to an embodiment of the disclosed technology. Then, as shown in FIG. 6, the lateral recess 1070 is filled with a dielectric material to form a body spacer 1012. For example, the filling may be performed by depositing the dielectric material, and then etching it back (by, for example, RIE). The body spacer 1012 may comprise nitride (for example, silicon nitride) or a low-K dielectric such as SiOF, SiCOH, SiO, SiCO and SiCON. In a case where the deposited dielectric comprises nitride, a thin oxide layer (not shown) may be optionally deposited as a pad layer before depositing the dielectric, to mitigate stress of the nitride.

After the initial fins 1061, 1062 having the respective body spacers are formed in the above process, gate stacks intersecting the respective fins may be formed to achieve final semiconductor devices.

To isolate the gate stack from the substrate, an isolation layer 1014 may be formed on the substrate. This isolation layer 1014 may be formed, for example, by depositing a dielectric material on the substrate 1000, and then etching it back. In the back-etching, an etching depth may be controlled so that the back-etched isolation layer 1014 makes a portion of the body spacer 1012 expose (or protrude relative to a top surface of the isolation layer 1014). In an example, the isolation layer 1014 may include High Density Plasma (HDP) oxide, such as silicon oxide.

Figure 7:
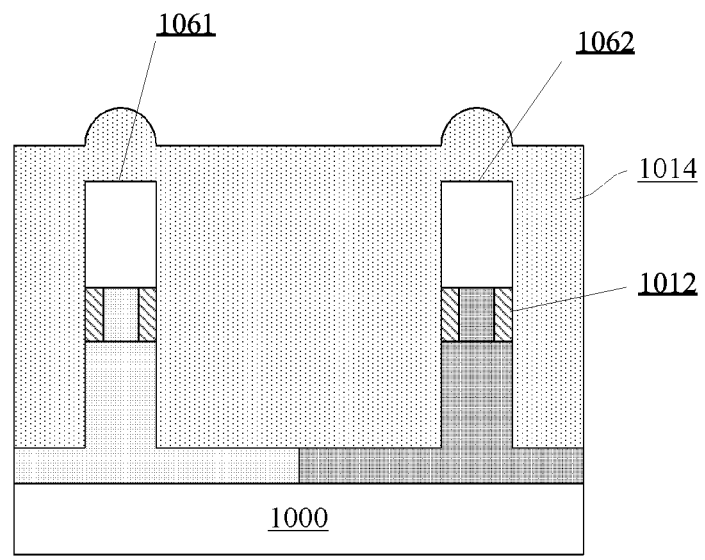
FIG. 7 is a cross sectional view during an intermediate step of the method of manufacturing a FinFET device according to an embodiment of the disclosed technology.

FIG. 7 is a cross sectional view during an intermediate step of the method of manufacturing a FinFET device according to an embodiment of the disclosed technology. To improve uniformity in level of (the top surface of) the isolation layer 1014 after being etched back, and thus improve uniformity in height of the finally-formed fins 1061, 1062, the dielectric material 1014 may be deposited in such a way that it substantially covers the initial fin 1061, 1062 (i.e., in case of multiple initial fins, substantially fills up gaps between the initial fins), as shown in FIG. 7. According to embodiments of the disclosed technology, the dielectric material may be deposited such that a portion of the dielectric material on top of the initial fins has a thickness sufficiently less than that of a portion of the dielectric material on the substrate. In general, the thickness of the portion of the dielectric material on top of the initial fins is less than ⅓, such as ¼, of the thickness of the portion of the dielectric material on the substrate. In an example, the portion of the dielectric material on top of each of the initial fins may have a thickness no more than 20 nm, and the portion of the dielectric material on the substrate may have a thickness up to about 100 nm.

According to an example of the disclosed technology, the dielectric material 1014 may comprise oxide (e.g., silicon oxide) formed by High Density Plasma (HDP) deposition. Due to characteristics of HDP, the thickness of the dielectric material 1014 on top of the initial fins 1061, 1062 (in a direction perpendicular to the substrate 1000) and on side surfaces of the initial fins 1061, 1062 (in a direction parallel to the substrate 1000, i.e., a lateral direction) is less than that of the dielectric material between the initial fins 1061 1062 on the substrate 1000 (in a direction perpendicular to the substrate 1000) during the deposition. Due to such characteristics, the HDP deposition is conventionally not used to make oxide isolation.

Here, by controlling, for example, deposition conditions, the thickness of the portion of the dielectric material 1014 on top of each of the initial fins 1061, 1062 may be less than ½ of a spacing between an initial fin 1061 and its neighboring initial fin 1062 when the dielectric material 1014 substantially covers the initial fins 1061, 1062 (or substantially fills up the gaps between the initial fins 1061, 1062). If spacing between the initial fins are not the same, the thickness of the portion of the dielectric material 1014 on top of each of the initial fins may be less than ½ of a narrower one of the spacings between the initial fin and its neighboring initial fins.

Figure 8:
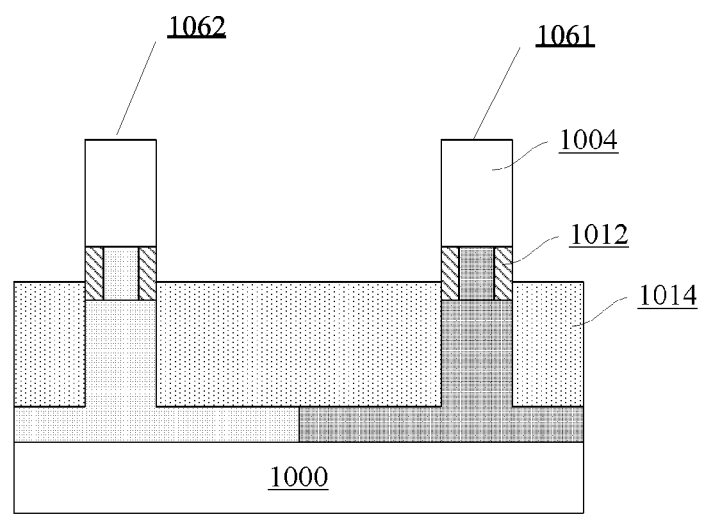
FIG. 8 is a cross sectional view during an intermediate step of the method of manufacturing a FinFET device according to an embodiment of the disclosed technology.

FIG. 8 is a cross sectional view during an intermediate step of the method of manufacturing a FinFET device according to an embodiment of the disclosed technology. Next, the dielectric material 1014 is etched back as shown in FIG. 8. As the back-etching of the dielectric material 1014 is performed with a relatively small depth, it is relatively easy to control the etching, and it is thus possible to more accurately control a distance from the top surface of the fin 1061, 1062 (in this example, the top surface of the second semiconductor layer 1004) to the top surface of the isolation layer 1014 (which determines at least partially a fin height of the final device and thus a channel width of the final device), so that the distance is kept substantially constant across the substrate. In this way, the isolation layer 1014 may define the fins above the isolation layer 1014. In an example where the first semiconductor layer 1002-1 and 1002-2 is doped as described above, it results in a threshold voltage higher than that in the second semiconductor layer 1004. Therefore, by controlling a gate control voltage, the second semiconductor layer 1004 may be conducted while the first semiconductor layer 1002 may not be conducted. As such, the fins used in the final devices may include only the second semiconductor layer 1004, and the first semiconductor layer 1002 may act as a punch-through stopper to prevent punch-through between source and drain.

In an example, the protection layer 1006 and the dielectric material 1014 comprise the same material, such as oxide. Therefore, in the process of etching back the dielectric material 1014, the protection layer 1006 may be removed at the same time, as shown in FIG. 8.

Figure 9A:
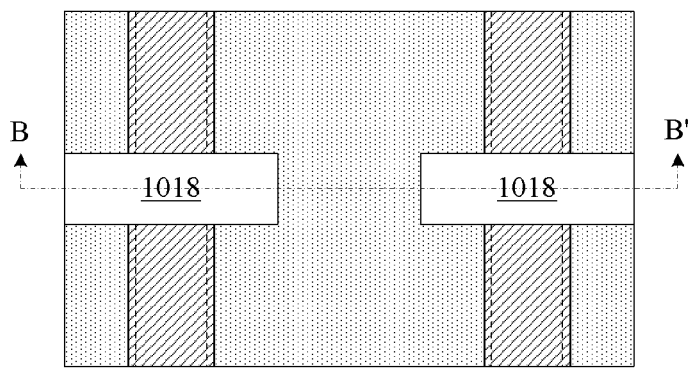
FIG. 9A is a view during an intermediate step of the method of manufacturing a FinFET device according to an embodiment of the disclosed technology.
Figure 9B:
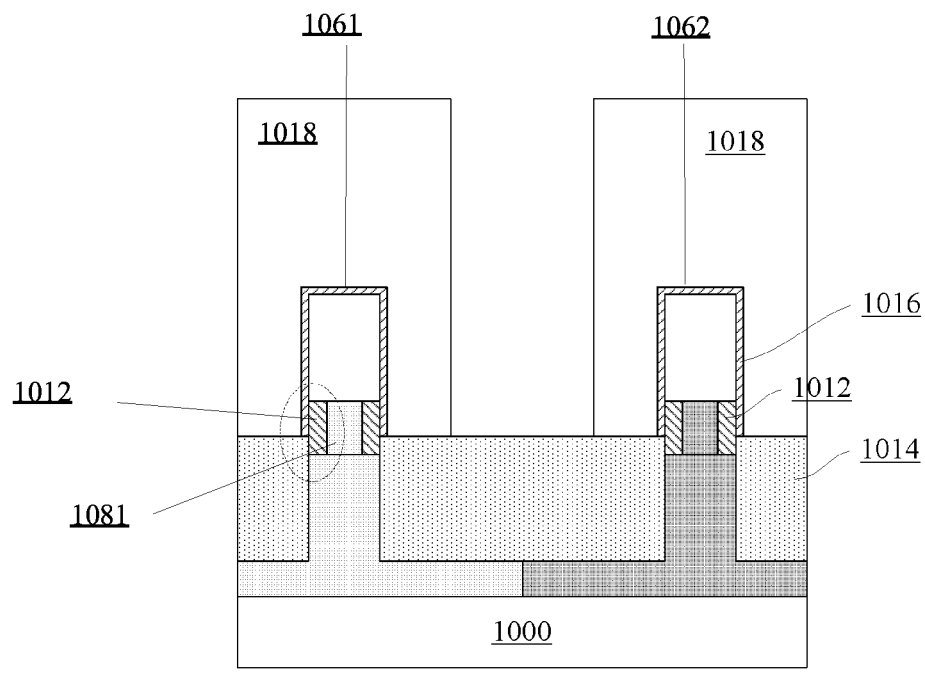
FIG. 9B is a cross sectional view along line BB' in FIG. 9A during an intermediate step of the method of manufacturing a FinFET device according to an embodiment of the disclosed technology.

FIG. 9A is a view during an intermediate step of the method of manufacturing a FinFET device according to an embodiment of the disclosed technology. FIG. 9B is a corresponding cross sectional view along line BB' in FIG. 9A, Then, gate stacks intersecting the respective fins may be formed on the isolation layer 1014. For example, this may be done as follows. In an embodiment, as shown in FIG. 9A a gate dielectric layer 1016 may be formed through, for example, deposition. The gate dielectric layer 1016 may comprise, for example, oxide with a thickness of about 0.8-1.5 nm. Although the gate dielectric layer 1016 is shown in FIG. 9B as a shape of "Π," the gate dielectric layer 1016 may also include a portion extending onto the surface of the isolation layer 1014. Then, a gate conductor layer 1018 may be formed through, for example, deposition. The gate conductor layer 1018 may comprise, for example, polysilicon. The gate conductor layer 1018 may fill up the gaps between the fins, and may be planarized by, for example, Chemical Mechanical Polishing (CMP). Next, the gate conductor layer 1018 is patterned to form the gate stacks. The gate conductor layer 1018 is patterned into strips intersecting the respective fins in the example of FIG. 9A and 9B. In another embodiment, the gate dielectric layer 1016 may be further patterned with the patterned gate conductor layer 1018 as a mask.

As denoted by a dotted-line ellipse in FIG. 9B the body spacer 1012 exists between the gate conductor 1018 and the fin at the bottom of the fin 1081 (the portion of the fin beneath the bottom is surrounded by the isolation layer 1014, and thus will not act as a real fin in the final device where the channel is to be formed), resulting in a relatively small parasitic capacitance.

In an implementation, after forming the patterned gate conductor, halo implantation and extension implantation may be performed with the gate conductor as a mask.

Figure 10A:
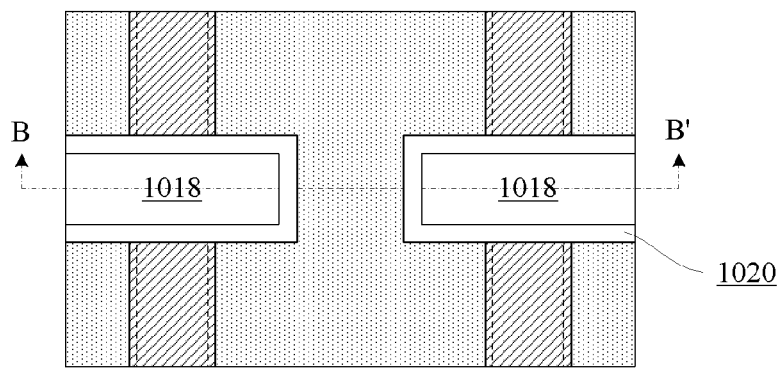
FIG. 10A is a view during an intermediate step of the method of manufacturing a FinFET device according to an embodiment of the disclosed technology.
Figure 10B:
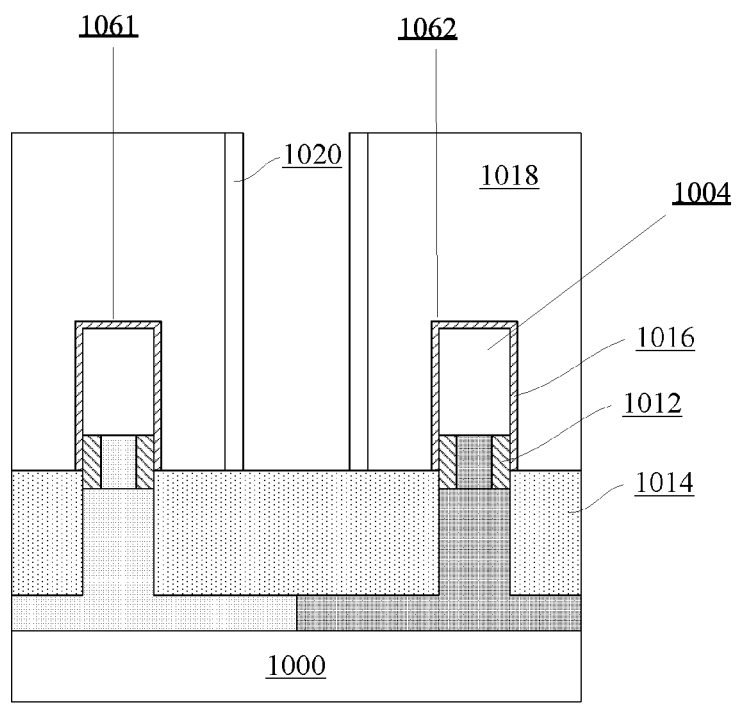
FIG. 10B is a cross sectional view along line BB' in FIG. 10A during an intermediate step of the method of manufacturing a FinFET device according to an embodiment of the disclosed technology.

FIG. 10A is a view during an intermediate step of the method of manufacturing a FinFET device according to an embodiment of the disclosed technology. FIG. 10B is a corresponding cross sectional view along line BB' in FIG. 10A. Next, as shown in FIGS. 10A and 10B, a spacer 1020 may be formed on side walls of the gate conductor layer 1018. The spacer 1020 may be formed by, for example, depositing a nitride layer with a thickness of about 5-30 nm, and then applying RIE on the nitride layer. There are various approaches for forming such a spacer, and details thereof will be omitted here.

The spacer 1020 includes substantially no portion formed on side walls of the fins when the trenches between the fins have a tapered shape narrowed from top down (it is generally the case due to characteristics of the etching).

After forming the spacer, source/drain (S/D) implantation may be performed with the gate conductor and the spacer as a mask. Then, the implanted ions may be activated through annealing to form source/drain regions, resulting in the semiconductor device of the embodiment. As shown in FIGS. 10A and 10B, the semiconductor device may comprise: the substrate 1000; the patterned first and second semiconductor layers 1002 and 1004 sequentially formed on the substrate 1000; the isolation layer 1014 formed on the substrate 1000, wherein the isolation layer 1014 has a top surface located between top and bottom surfaces of the first semiconductor layer 1002, and thus defines a fin above the isolation layer 1014; and the gate stack formed on the isolation layer 1014 and intersecting the fin. The first semiconductor layer 1002 may be recessed in the lateral direction relative to the second semiconductor layer 1004, and the semiconductor device may further comprise the body spacer 1012 formed in the lateral recess.

For a p-type device, the first semiconductor layer 1002-2 may be doped with n-type impurities, while for an n-type device, the first semiconductor layer 1002-1 may be doped with p-type impurities. Such a doped first semiconductor layer 1002 may act as a punch-through stopper. In addition, the doped first semiconductor layer 1002 may reduce B diffusion, resulting in a clear junction between the channel region and the substrate body.

In the above embodiment, the gate stacks are formed directly after the formation of the fins. The disclosed technology is not limited thereto, and the gate last process is also applicable.

In a further embodiment of the disclosed technology, the gate dielectric layer 1016 and the gate conductor layer 1018 formed in FIGS. 9A and 9B may be a sacrificial gate dielectric layer and a sacrificial gate conductor layer, respectively. Subsequent processes may be performed in the way described above in conjunction with FIGS. 9 and 10.

Figure 11A:
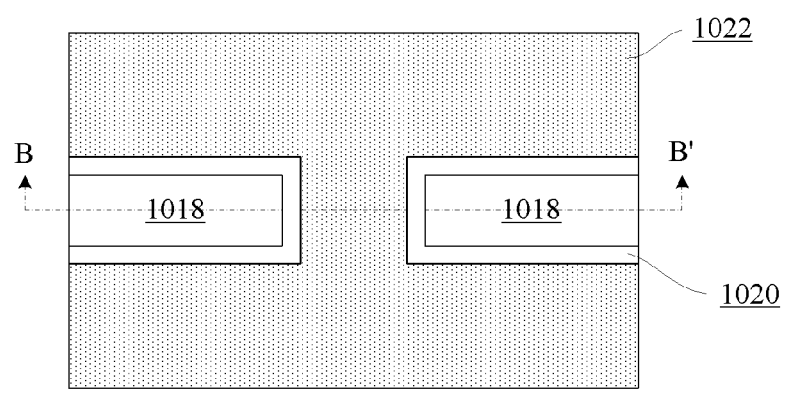
FIG. 11A is a view during an intermediate step of the method of manufacturing a FinFET device according to an embodiment of the disclosed technology.
Figure 11B:
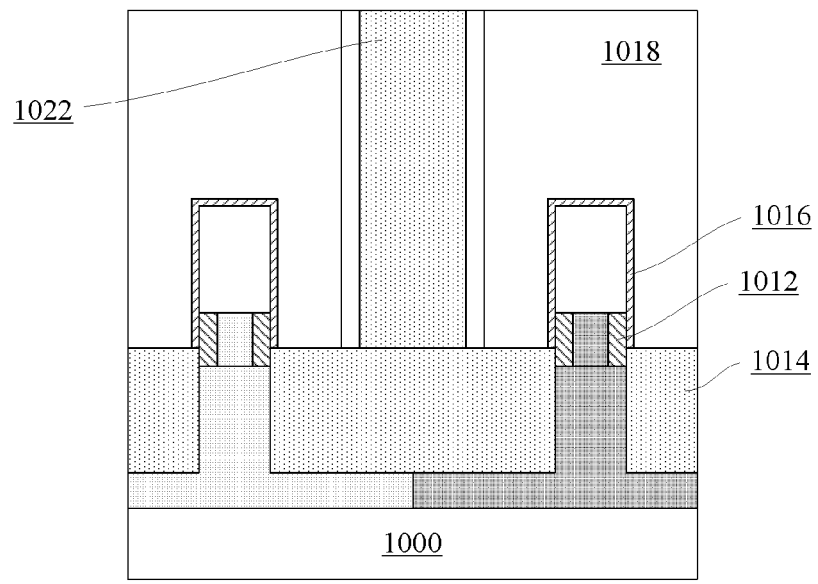
FIG. 11B is a cross sectional view along line BB' in FIG. 11A during an intermediate step of the method of manufacturing a FinFET device according to an embodiment of the disclosed technology.

FIG. 11A is a view during an intermediate step of the method of manufacturing a FinFET device according to an embodiment of the disclosed technology. FIG. 11B is a corresponding cross sectional view along line BB' in FIG. 11A. Next, as shown in FIGS. 11A and 11B, a further dielectric layer 1022 may be formed through, for example, deposition. The dielectric layer 1022 may comprise oxide, for example. Then, the dielectric layer 1022 is planarized by, for example, chemical mechanical planarization (CMP), which may stop at the spacer 1020, thereby exposing the sacrifice gate conductor layer 1018.

Figure 12A:
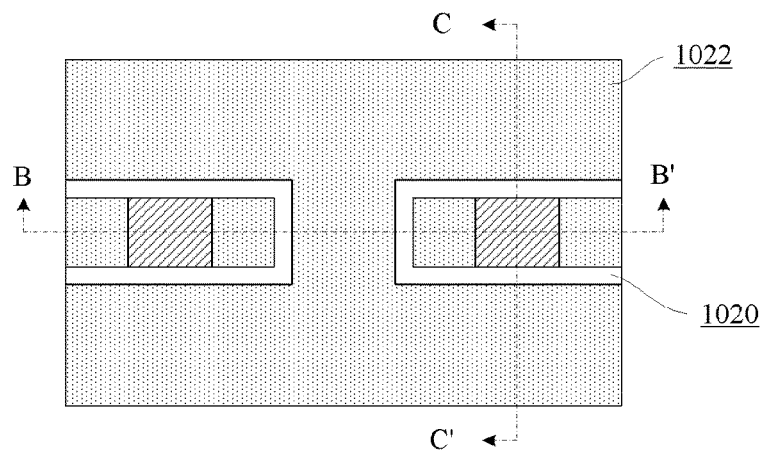
FIG. 12A is a view during an intermediate step of the method of manufacturing a FinFET device according to an embodiment of the disclosed technology.
Figures 12B, 12C:
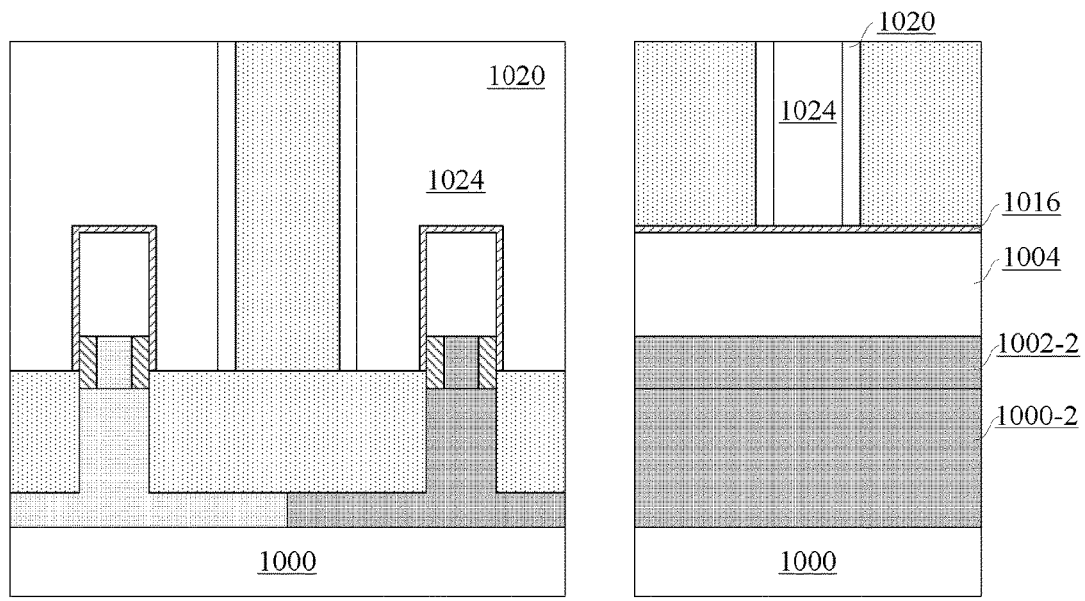
FIG. 12B is a cross sectional view along line BB' in FIG. 12A during an intermediate step of the method of manufacturing a FinFET device according to an embodiment of the disclosed technology.
FIG. 12C is a cross sectional view along line CC' in FIG. 13A during an intermediate step of the method of manufacturing a FinFET device according to an embodiment of the disclosed technology.
Figure 14:
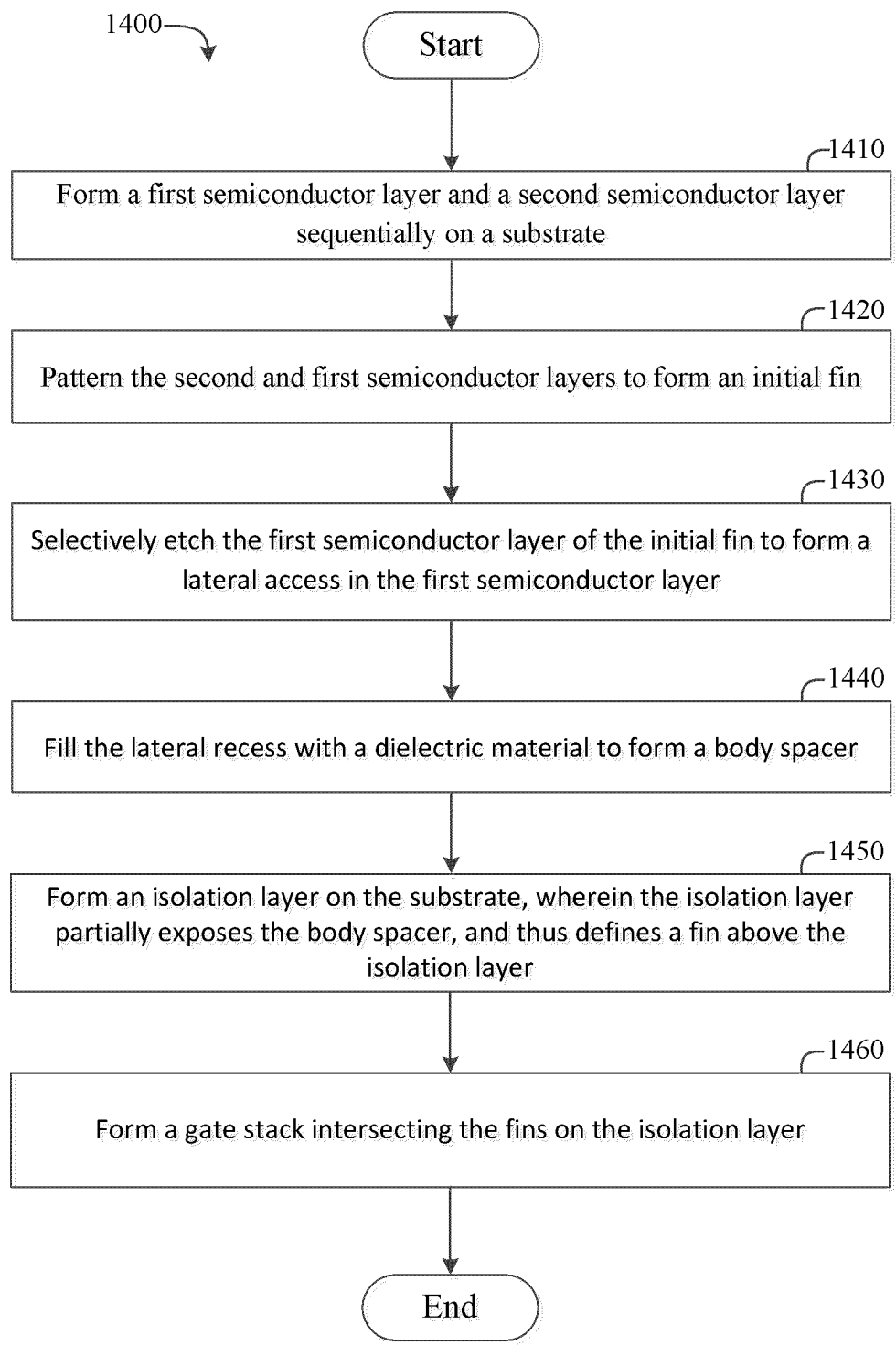
FIG. 14 is a flowchart illustrating an embodiment of manufacturing a FinFET device according to the disclosed technology.

FIG. 12A is a view during an intermediate step of the method of manufacturing a FinFET device according to an embodiment of the disclosed technology. FIGS. 12B and 12C are cross sectional views along lines BB' and CC' in FIG. 12A, respectively. Subsequently, as shown in FIGS. 12A, 12B, and 12C, the sacrifice gate conductor layer 1018 may be selectively removed by, for example, a tetramethylammonium hydroxide (TMAH) solution, and thus a void 1024 is formed within the spacer 1020. In another example, the sacrifice gate dielectric layer 1016 may be further removed.

FIG. 13A is a view during an intermediate step of the method of manufacturing a FinFET device according to an embodiment of the disclosed technology. FIGS. 13B and 13C are cross sectional views along lines BB' and CC' in FIG. 13A, respectively. Next, as shown in FIGS. 13A, 13B, and 13C, a final gate stack is formed by forming a gate dielectric layer 1026 and a gate conductor layer 1028 in the void 1024. The gate dielectric layer 1026 may comprise a high-K gate dielectric, such as HfO2, with a thickness of about 1-5 nm. The gate conductor layer 1028 may comprise a metal gate conductor. Further, a work function adjustment layer (not shown) may be formed between the gate dielectric layer 1022 and the gate conductor layer 1024.

Although the gate dielectric layer 1026 is shown in FIGS. 13A, 13B, and 13C as a thin layer at the bottom of the void 1024, the gate dielectric layer 1026 may be also formed on side walls of the void 1024 and thus surround the gate conductor layer 1028. In an embodiment, the structure of the semiconductor device manufactured according to FIGS. 13A and 13B is substantially the same as the semiconductor device of FIGS. 10A and 10B, except that the gate stack is formed in a different manner.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

The disclosed technology is described above with reference to the embodiments thereof. However, those embodiments are provided just for illustrative purpose, rather than limiting the disclosed technology. The scope of the disclosure is defined by the attached claims as well as equivalents thereof. Those skilled in the art can make various alternations and modifications without departing from the scope of the disclosure, which all fall within the scope of the disclosure.

What is claimed is:

1. A semiconductor device comprising:
   a substrate;
   a first semiconductor layer;
   a second semiconductor layer, the first and second semiconductor layers patterned, the first and second semiconductor layers sequentially formed on the substrate;
   an isolation layer formed on the substrate, wherein the isolation layer has a top surface located between top and bottom surfaces of the first semiconductor layer to define a fin comprising the patterned first and second semiconductor layers and the length dimension of the fin extending in a first direction above the isolation layer; and
   a gate stack formed on the isolation layer and the length dimension of the gate stack extending in a second direction crossing the first direction to intersect the length dimension of the fin, wherein the first semiconductor layer is recessed relative to the second semiconductor layer so as to define a lateral recess, the length dimension of the lateral recess extending in the second direction, and the semiconductor device further comprises a body spacer formed in the lateral recess.

2. The semiconductor device of claim 1, wherein the substrate comprises bulk Si, wherein the first semiconductor layer comprises SiGe, and wherein the second semiconductor layer comprises Si.

3. The semiconductor device of claim 1, wherein the body spacer comprises nitride or a low-K dielectric, and the isolation layer comprises oxide.

4. The semiconductor device of claim 1, wherein the gate stack comprises a high-K gate dielectric layer and a metal gate conductor layer.

5. The semiconductor device of claim 1, wherein the first semiconductor layer is doped with n-type impurities for a p-type device.

6. The semiconductor device of claim 1, wherein the first semiconductor layer is doped with p-type impurities for an n-type device.

7. The semiconductor device of claim 1, wherein there are two body spacers each sandwiched between the gate stack and a corresponding side wall of the first semiconductor layer.

8. The semiconductor device of claim 1, wherein the second semiconductor layer has its side walls opposite to each other in the second direction covered by the gate stack, and the first semiconductor layer has its side walls opposite to each other in the second direction positioned inwards with respect to the respective side walls of the second semiconductor layer to define the lateral recess.

9. The semiconductor device of claim 1, wherein a portion of the fin intersecting the gate stack defines a channel region, and wherein the device further comprises a source region and a drain region formed in portions of the fin on opposite sides with respect to the channel region, wherein the first direction is a direction from the source region to the drain region or vice versa.

10. The semiconductor device of claim 1, wherein the first semiconductor layer has a length in the first direction substantially the same as that of the second semiconductor layer in the first direction.

11. The semiconductor device of claim 10, wherein the first semiconductor layer is in physical contact with the second semiconductor layer across substantially all the length thereof.

\* \* \* \* \*

UNITED STATES PATENT AND TRADEMARK OFFICE
CERTIFICATE OF CORRECTION

PATENT NO. : 9,564,434 B2
APPLICATION NO. : 14/705835
DATED : February 7, 2017
INVENTOR(S) : Huilong Zhu It is certified that error appears in the above-identified patent and that said Letters Patent is hereby corrected as shown below:

On the Title Page

Item (71), Applicant at Line 1, Change "Microlectronics," to --Microelectronics,--.

In Column 2 (page 2, item (56)) at Line 10, Under Other Publications, change "20120448458.4." to --201210448458.4.--.

Signed and Sealed this
Tenth Day of April, 2018

Andrei Iancu
*Director of the United States Patent and Trademark Office*